United States Patent
Nguyen

(10) Patent No.: US 11,081,604 B2
(45) Date of Patent: Aug. 3, 2021

(54) DEVICE AND METHOD FOR BOWTIE PHOTOCONDUCTIVE ANTENNA FOR TERAHERTZ WAVE DETECTION

(71) Applicant: Truong Khang Nguyen, Ho Chi Minh (VN)

(72) Inventor: Truong Khang Nguyen, Ho Chi Minh (VN)

(73) Assignee: Ton Duc Thang University, Ho Chi Minh (VN)

( * ) Notice: Subject to any disclaimer, the term of this patent is extended or adjusted under 35 U.S.C. 154(b) by 0 days.

(21) Appl. No.: 14/828,472

(22) Filed: Aug. 17, 2015

(65) Prior Publication Data

US 2021/0057594 A1 Feb. 25, 2021

(51) Int. Cl.
| | | |
|---|---|---|
| *H01L 31/0232* | (2014.01) | |
| *H01L 31/0304* | (2006.01) | |
| *H01L 31/0224* | (2006.01) | |
| *H01L 31/18* | (2006.01) | |
| *H01Q 9/28* | (2006.01) | |
| *H01Q 19/06* | (2006.01) | |

(52) U.S. Cl.
CPC .... *H01L 31/0304* (2013.01); *H01L 31/02327* (2013.01); *H01L 31/022408* (2013.01); *H01L 31/184* (2013.01); *H01Q 9/285* (2013.01); *H01Q 19/062* (2013.01)

(58) Field of Classification Search
CPC ....... H01L 31/022408; H01L 31/02327; H01L 31/0304; H01L 31/184; H01Q 19/062; H01Q 9/285

See application file for complete search history.

(56) References Cited

U.S. PATENT DOCUMENTS

| | | | | |
|---|---|---|---|---|
| 2005/0215031 A1* | 9/2005 | Ouchi | ................... | G01J 3/0256 438/459 |
| 2005/0230705 A1* | 10/2005 | Taylor | ................... | B82Y 20/00 257/120 |
| 2010/0301217 A1* | 12/2010 | Sertel | ................... | G01J 1/4228 250/338.4 |
| 2010/0328779 A1* | 12/2010 | Llombart Juan | ...... | H01Q 21/06 359/619 |
| 2012/0112230 A1* | 5/2012 | Jun | ...................... | H01Q 19/062 257/98 |
| 2012/0113417 A1* | 5/2012 | Linfield | ................. | C30B 25/02 356/300 |
| 2014/0346357 A1* | 11/2014 | Jarrahi | .................... | H01L 31/09 250/338.4 |

\* cited by examiner

*Primary Examiner* — Mark R Gaworecki

(57) ABSTRACT

A process of fabricating and a photoconductive antenna are disclosed which include a semi-insulating substrate having a top side and a bottom side; a low-temperature Gallium Arsenide (GaAs) layer deposited on the top side of the semi-insulating substrate; a plurality of metal electrodes having a bowtie dipole, with an excitation gap at the center, deposited directly on the low-temperature Gallium Arsenide layer; and an extended hemispherical lens attached to the bottom side of the semi-insulating substrate; the extended hemispherical lens further comprises an extension layer and a hemispherical layer separated by an extended line whose position is selected so that a beam of light coming from outside of the extended hemispherical lens is collimated to the excitation gap.

20 Claims, 7 Drawing Sheets

DEVICE AND METHOD FOR BOWTIE PHOTOCONDUCTIVE ANTENNA FOR TERAHERTZ WAVE DETECTION

FIELD OF THE INVENTION

The present invention relates to an efficient photoconductive antenna, a terahertz time domain spectroscopy system, and a method for generation and detection of terahertz waves.

BACKGROUND ART

Terahertz (THz) radiation includes frequencies in the 1-30 THz range which is defined as the electromagnetic radiation between the microwave and infrared regions of the electromagnetic spectrum (THz radiation is hereinafter referred to as "THz waves"). THz waves penetrate non-conducting materials as well as microwave signals and produce high-resolution images as well as light. However, unlike any other electromagnetic waves, THz waves are strongly attenuated in water. Therefore, in recent years, fascinating characteristics of THz waves have many practical applications such as spectroscopy, pharmaceutical applications, medical imaging, and communication technologies. For example, THz waves are used to see through the internal structure of opaque objects, to analyze a molecular-level mechanism, and to transmit radio signals into space.

However, in a certain frequency region, the efficiency degradation of THz waves limits their applications to a handful number of areas where highly reliable performances are required. Consequently, in this frequency region, known as the terahertz gap, suitable and efficient signal sources are required. Fortunately, recent advances in laser and semiconductor technology have stimulated the development of new THz sources and given new impetus to THz research and also boost possibility of THz technologies commercialization.

Many sources have been developed to efficiently generate THz waves such as: a photoconductive antennas, an optical rectification for pulse sources, photo-mixers, hot-hole lasers, free-electron lasers, and quantum cascade lasers for continuous wave (CW) sources. Among them, using a photoconductive antenna is a widely used way to generate and detect THz waves. A photoconductive antenna is typically comprised of two electrodes on the semiconductor substrate having a relatively large electron mobility and a sub-picosecond carrier lifetime. The photoconductive antenna is gated by femtosecond laser pulses to generate photo-carriers. These photo-carriers are excited by the applied bias voltage across the electrode to induce an instantaneous current flow. In addition, the photoconductive antenna plays an important role to emit THz waves propagating through space with a broad frequency spectrum.

The performance of a photoconductive antenna depends mainly on the following factors: the substrate material, geometry of the active area, geometry of the antenna, and excitation laser pulse. Several approaches to improve the emission characteristics on the basis of these factors have been proposed theoretically and experimentally in recent decades. Particularly, recent development has revealed that the shapes of the antenna and substrate lens are crucial to optimize the coupling of THz waves between the device and free space.

Therefore what is needed is a photoconductive antenna that can solve the above described problems of the THz waves.

SUMMARY OF THE INVENTION

Accordingly, an objective of the present invention is to provide a photoconductive antenna with bowtie electrodes that are lithographically patterned on a low temperature Gallium Arsenide (LT-GaAs) possessing a short carrier lifetime.

Another aspect of the present invention also provides a photoconductive antenna that may have high THz output power using an extended hemispherical silicon lens with an appropriate shape.

Still another aspect of the present invention also provides a photoconductive antenna that may have increased detection sensitivity at low THz frequencies and that may be used for sensitive room-temperature detection of THz radiation in the low THz frequency region.

Finally another aspect of the present invention is to provide a method of fabricating a THz photoconductive antenna that includes forming a semiconductor substrate; forming a low temperature semiconductor layer on top of the semiconductor substrate; forming a plurality of metal electrodes having a bowtie shape and an excitation gap directly on top of the thin film semiconductor layer; forming a semi-hemisphere lens having an extension layer and a semi-hemisphere layer; and attaching and align the semi-hemisphere lens to the bottom side of the semiconductor substrate.

These and other advantages of the present invention will no doubt become obvious to those of ordinary skill in the art after having read the following detailed description of the preferred embodiments, which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
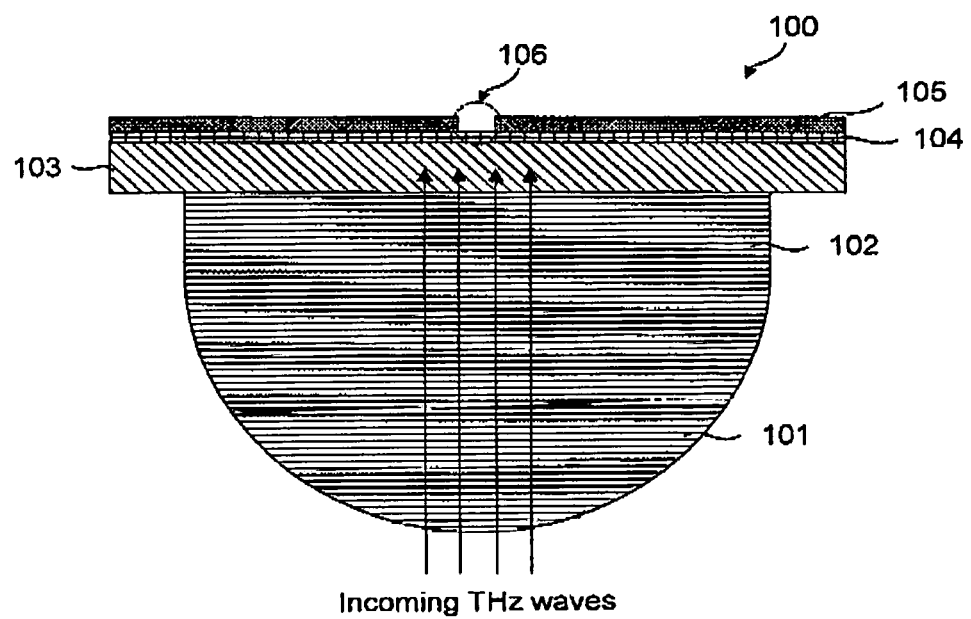
FIG. 1 illustrates a structure of a photoconductive antenna on a silicon lens in accordance with an embodiment of the present invention.

Now referring to FIG. 1, FIG. 1 illustrates a cross-section view of a photoconductive antenna 100 according to an embodiment of the present invention. Photoconductive antenna 100 is produced by growing a low temperature Gallium Arsenide (hereinafter referred to as "LT-GaAs") film 104 on a GaAs substrate 103. Metal electrodes 105 placing on the top side of LT-GaAs film 104 and GaAs substrate 103. An extended hemispherical lens 101 is attached on the bottom side of GaAs substrate 103. In one embodiment, extended hemispherical lens 101 is made of silicon (Si).

Continuing with FIG. 1, metal electrodes 105 are co-planar and made of a titanium-gold (Ti—Au) thin film with a thickness in the range of 0.1 to 0.5 μm and with a conductivity of about $1.6 \times 10^7$ S/m. To generate THz waves, a user applies bias voltage across metal electrodes 105. Metal electrodes 105 might have different geometries. In one embodiment of the present invention, electrodes 105 have a bowtie-shaped dipole which will be described in detail in FIG. 3.

Continuing with FIG. 1, LT-GaAs film 104 is grown as a functional layer of photoconductive antenna 100 which is important in generating the excited carriers under irradiation by optical pulses. For use as a photoconductive antenna, LT-GaAs film 104 is grown using techniques such as MBE (Molecular Beam Epitaxy) in the low temperature range of 200° C. to 400° C. More specifically, the functional layer LT-GaAs preferably has a resistivity of more than $10^8$ Ωcm, a carrier lifetime of less than 1 pico seconds (ps), a macro defect density of less than 5 $cm^{-2}$, and a dislocation density of less than $5 \times 10^6$ $cm^2$.

Continuing still with FIG. 1, LT-GaAs film 104 is grown on GaAs substrate 103. GaAs substrate 103 had an orientation of (100) and preferably had a thickness in the range of 100 μm to 500 μm. In the present invention, the thickness of GaAs substrate 103 was chosen to be 350 μm which was assembled from commercially available GaAs wafer (i.e., typical high optical quality, 100-500 μm thick, wafer).

Figure 2:
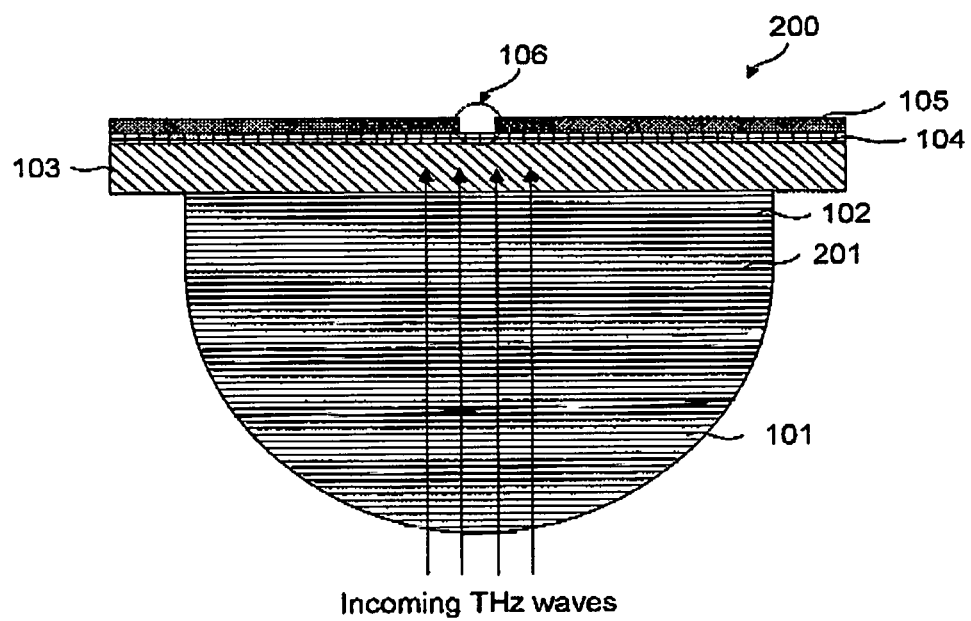
FIG. 2 illustrates a structure of a photoconductive antenna on a Si lens in accordance with an embodiment of the present invention.

Now referring to FIG. 2 which illustrates extended hemispherical lens 101 in accordance with an embodiment of the present invention. The structure of extended hemispherical lens 101 lens allows THz waves to pass through with low loss, and is used for alignment purposes such as focusing THz waves.

Extended hemispherical lens 101 is comprised of an extension layer 102. In this present invention, extended hemispherical lens 101 is made of silicon (Si) and attached to the bottom side of GaAs substrate 103 since silicon has a permittivity close to that of GaAs which can be easily processed into a lens, and has low dielectric losses.

Continuing with FIG. 2, in one embodiment, extended hemispherical lens 101 has a radius of 5 mm because of the two following reasons: the first is that the 5-mm radius lens is typical and commercially available; the second is that such relatively big lens can produce good beam collimation and thus THz beam detection is easier.

Extension layer 102 is selected to obtain a good beam collimation while maintaining extended hemispherical lens 101 at a fixed size. A ratio of T/R is used to optimize the overall lens shape in order to achieve a maximum radiation directivity characteristic; where T is defined as a distance from metal electrodes 105 to extended line 201 and R is the radius of the extended hemispherical lens 101. In the present invention, the T/R is chosen with a value of 0.36. Accordingly extended hemispherical lens 101 may have a thickness of 1.45 mm.

Figure 3:
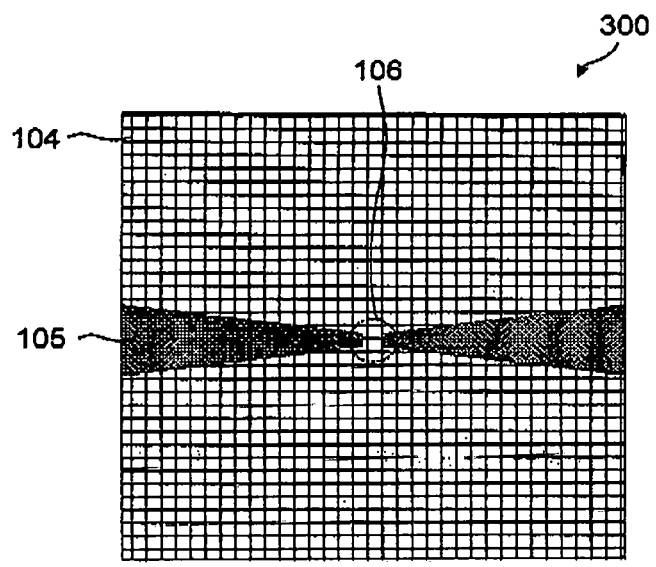
FIG. 3 illustrates a top plan view of the bowtie electrode with excitation gap in accordance with an embodiment of the present invention.

Next referring to FIG. 3. FIG. 3 is a top plant view of metal electrodes 105 with an excitation gap 106 for excitation. Metal electrodes 105 have a bowtie shape and can be lithographically patterned on a low temperature Gallium Arsenide layer epitaxial layer such as LT-GaAs film 104. The functional layer LT-GaAs film 104 is described in detail FIG. 1 in which low temperature GaAs material is grown using techniques such as MBE (Molecular Beam Epitaxy) in the low temperature range of 200° C. to 400° C. More specifically, the functional layer LT-GaAs film 104 preferably has a resistivity of more than $10^8$ Ωcm, a carrier lifetime of less than 1 ps, a macro defect density of less than 5 $cm^{-2}$, and a dislocation density of less than $5 \times 10^6$ $cm^2$.

Continuing with FIG. 3, metal electrodes 105 are made of a titanium-gold (Ti—Au) thin film with a thickness in the range of 0.1 μm to 0.5 μm and with a conductivity of about $1.6 \times 10^7$ S/m. The total length of the bow arms is about 13 mm which is equal to the lateral size of both LT-GaAs film 104 and GaAs substrate 103. Metal electrodes 105 have a very narrow angle. In this present invention, the width at the feeding gap of metal electrodes 105 is 10 μm while the width at the bowtie ends amounts to 1.5 mm. The DC bias voltage is applied directly to metal electrodes 105 through these bowtie ends. Metal electrodes 105 are irradiated with an optical pulse and the excited carriers make LT-GaAs film 104 conductive instantaneously. Excitation gap 106 at the center area for such optical excitation is in the range of 5 to 20 μm. In this present invention, this gap is 5 μm.

Figure 4:
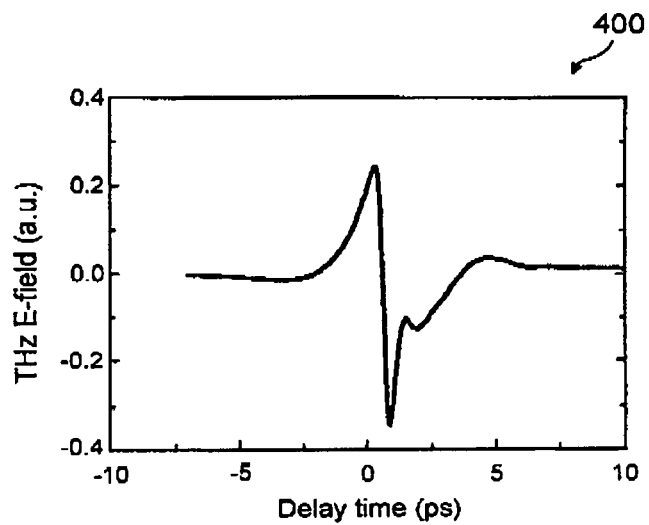
FIG. 4 is illustrates a detected spectrum of the antenna in the time-domain in accordance with an embodiment of the present invention.
Figure 5:
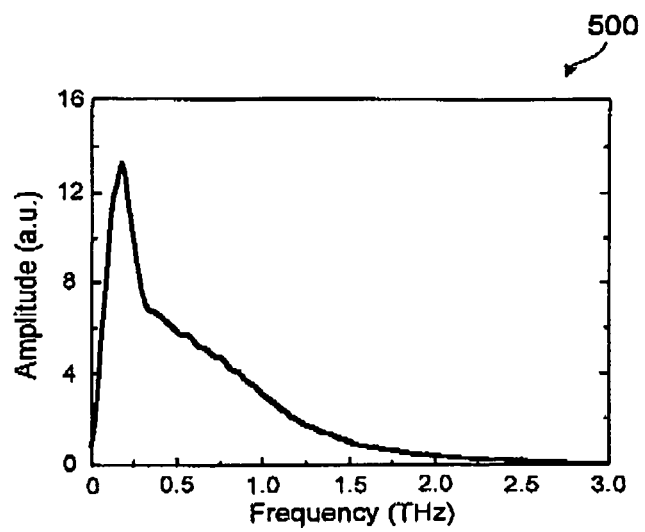
FIG. 5 illustrates a detected spectrum of the antenna in the frequency-domain in accordance with an embodiment of the present invention.

FIGS. 4 and 5 respectively show the measured emission spectrum of photoconductive antenna 100 in the detection side in time domain and frequency domain respectively.

Now referring to FIG. 4 which illustrates a graph 400 of the electromagnetic field strength of photoconductive antenna 100 in the time domain in pico-seconds seconds (ps). It can be seen from graph 400 that photoconductive antenna 100 of the present invention has insignificant delay time.

Next referring to FIG. 5 which illustrates a graph 500 of the electromagnetic field strength of photoconductive antenna 100 in the frequency domain. It can be seen that bowtie metal photoconductive antenna 105 in the present invention is highly sensitive at the detection side in the low frequency region, particularly in the frequency range of 0.1~1.0 THz. This makes photoconductive antenna 100 feasible for sensitive room-temperature detection of THz radiation in the low THz frequency region, such as efficient receivers for THz wireless communication systems.

Figure 6:
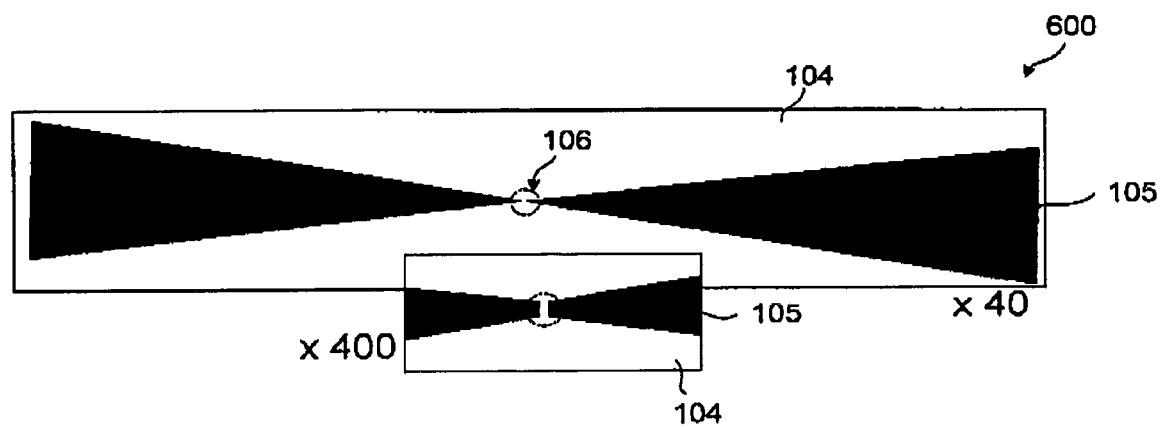
FIG. 6 illustrates an optical microscope image of the bowtie electrode on the LT-GaAs in accordance with an embodiment of the present invention

FIG. 6 illustrates an optical microscope image 600 of metal bowtie electrodes 105 in the present invention. Optical microscope image 600 includes a 40 times magnified image versus a 400 times magnified image of excitation gap 106.

It can be seen that in the 40 times magnified image, excitation gap 106 is hardly seen. The 400 times magnified image focuses more on excitation gap 106. In both images, bowtie shapes of metal electrodes 105 deposited over low temperature GaAs layer are demonstrated.

Figure 7:
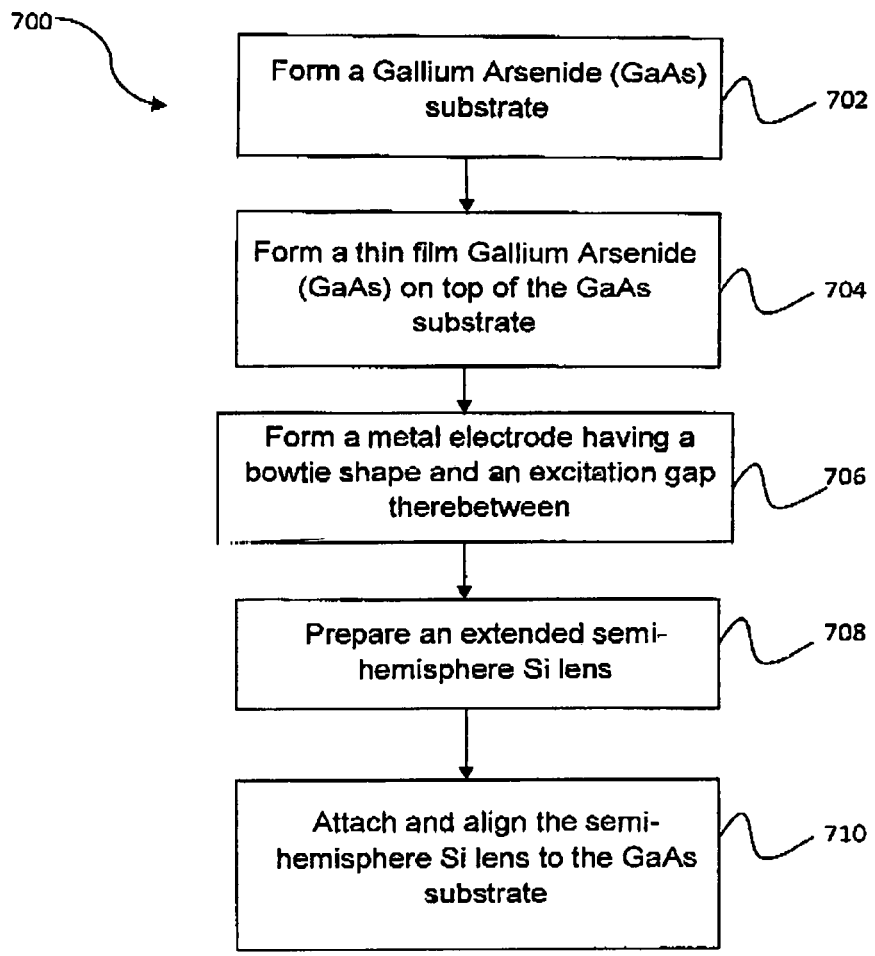
FIG. 7 is a flow chart illustrating a process of fabricating the photoconductive antenna in accordance with an embodiment of the present invention.

Finally, referring to FIG. 7. FIG. 7 illustrates a process 700 for fabricating photosensitive antenna 100 which includes forming a semiconductor substrate, forming a thin film semiconductor on top of said semiconductor substrate, forming metal electrodes having a bowtie shape with an excitation gap therebetween, forming an extended semi-hemisphere lens, and attaching and aligning extended semi-hemisphere lens to the semiconductor substrate.

At step 702, a GaAs substrate is formed. Step 702 is realized by Gallium Arsenide (GaAs) substrate 103.

Next, at step 704, a photoconductive thin film LT-GaAs 104 is deposited on top of GaAs substrate 103. Step 704 is realized by thin film LT-GaAs 104 grown in a low-temperature condition (LT-GaAs) using Molecular Beam Epitaxy (MBE) system.

At step 706, metal electrodes having a bowtie shape and an excitation gap therebetween as described in FIG. 1-FIG. 6 above are formed on top of the GaAs substrate. In practice, after completing the deposition of LT-GaAs film 104 on GaAs substrate 103, metal electrodes 105 having a bowtie shape and excitation gap 106 are directly formed on the LT-GaAs film 104 using photolithography technique.

Next, at step 708, an extended silicon lens is then prepared. In practice, step 708 is realized by the fabrication of extended hemispherical lens 101 described above and in FIG. 1. In one embodiment, extended hemisphere lens 101 also includes extension layer 102 with extended line 201 between them.

Finally, at step 710, extended hemisphere lens is carefully aligned and attached with Gallium Arsenide (GaAs) substrate so that excitation gap 106 is aligned with the axis of extended hemispherical lens 101.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A bowtie photoconductive antenna configured to detect terahertz waves, comprising:
    a substrate having a top side and a bottom side;
    a Gallium Arsenide (GaAs) layer deposited on said top side of said substrate;
    a plurality of metal electrodes deposited directly on said Gallium Arsenide layer; and
    an extended hemispherical lens attached to said bottom side of said substrate, wherein said plurality of metal electrodes comprises a bowtie-shaped dipole with an excitation gap at the center for optical pulse irradiation, and wherein said extended hemispherical lens further comprises an extension layer and a hemispherical layer separated by an extended line, wherein the position of said extended line within said extended hemispherical lens is selected so that a beam of light coming from outside of said extended hemispherical lens is collimated to said excitation gap.

2. The photoconductive antenna of claim 1, wherein said plurality of metal electrodes are made of gold/titanium with a thickness of 350 nm or less.

3. The photoconductive antenna of claim 1, wherein said plurality of metal electrodes have a total length of 13 mm.

4. The photoconductive antenna of claim 1, wherein said plurality of metal electrodes have the widths at the center and at the ends of 10 μm and 1.5 mm, respectively.

5. The photoconductive antenna of claim 1, wherein said GaAs layer is a functional layer which is grown on said substrate.

6. The photoconductive antenna of claim 1, wherein said GaAs layer has a thickness of 1.2 μm.

7. The photoconductive antenna of claim 1, wherein said GaAs layer has a carrier lifetime of less than 1 ps.

8. The photoconductive antenna of claim 1, wherein said GaAs layer has a resistivity of more than $10^8$ Ωcm.

9. The photoconductive antenna of claim 1, wherein said GaAs layer has a macro defect density less than 5 $cm^{-2}$.

10. The photoconductive antenna of claim 1, wherein said GaAs layer has a dislocation density of less than $5 \times 10^6$ $cm^2$.

11. The photoconductive antenna of claim 1, wherein said substrate has a permittivity of 12.9.

12. The photoconductive antenna of claim 1, wherein said substrate has a thickness of 350 μm.

13. The photoconductive antenna of claim 1, wherein said GaAs layer has a lateral size of 13 mm.

14. The photoconductive antenna of claim 1, wherein said extended hemispherical lens is made of silicon.

15. The photoconductive antenna of claim 1, wherein said extended hemispherical lens has a radius of 5 mm.

16. The photoconductive antenna of claim 1, wherein said extension layer has a thickness of 1.45 mm from said substrate.

17. The photoconductive antenna according to claim 1, wherein the ratio of the total thicknesses of said GaAs layer, said substrate, and said extended hemispherical lens to the radius of said extended hemispherical lens is 0.36.

18. A method of making a photoconductive antenna in the THz frequency range, comprising:
    forming a substrate;
    forming a Gallium Arsenide (GaAs) layer on top of said substrate;
    forming a plurality of metal electrodes having a bowtie shape and an excitation gap therebetween directly on top of said Gallium Arsenide (GaAs) layer;
    forming a semi-hemispherical lens having an extension layer and a semi-hemisphere layer; and
    attaching and align said semi-hemisphere lens to the bottom side of said substrate so that a beam of light coming from outside of said extended hemispherical lens is collimated to said excitation gap.

19. The process of claim 18 wherein said substrate is made of Gallium Arsenide (GaAs).

20. The process of claim 18, wherein said extended hemispherical lens has a radius of 5 mm, said extension layer has a thickness of 1.45 mm from said substrate, and wherein the ratio of the total thicknesses of said GaAs layer, said substrate, and said extended hemispherical lens to the radius of said extended hemispherical lens is 0.36.

* * * * *